(12) United States Patent
Shu

(10) Patent No.: US 7,679,168 B2
(45) Date of Patent: Mar. 16, 2010

(54) PRINTED CIRCUIT BOARD WITH DIFFERENTIAL PAIR ARRANGEMENT

(75) Inventor: Sheng-Yun Shu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 674 days.

(21) Appl. No.: 11/309,266

(22) Filed: Jul. 21, 2006

(65) Prior Publication Data
US 2007/0075432 A1    Apr. 5, 2007

(30) Foreign Application Priority Data
Aug. 12, 2005   (CN) .................... 2005 1 0036572

(51) Int. Cl.
*H01L 23/58* (2006.01)
*H01L 23/62* (2006.01)
(52) U.S. Cl. .................. 257/665; 257/692; 257/698; 257/773; 257/786; 257/E23.011
(58) Field of Classification Search .............. 257/664, 257/665, 696, 698, 773, 786, E23.011
See application file for complete search history.

(56) References Cited

U.S. PATENT DOCUMENTS

| | | | | |
|---|---|---|---|---|
| 5,639,989 A | * | 6/1997 | Higgins, III | 174/386 |
| 5,994,766 A | * | 11/1999 | Shenoy et al. | 257/659 |
| 6,215,184 B1 | * | 4/2001 | Stearns et al. | 257/738 |
| 6,323,116 B1 | * | 11/2001 | Lamson | 438/611 |
| 6,384,342 B1 | * | 5/2002 | Li | 174/258 |
| 6,777,802 B1 | * | 8/2004 | Mora et al. | 257/691 |
| 6,972,380 B2 | | 12/2005 | Lee | |
| 7,227,254 B2 | * | 6/2007 | Devnani et al. | 257/691 |
| 7,361,846 B2 | * | 4/2008 | Chiang et al. | 174/260 |
| 2005/0253253 A1 | * | 11/2005 | Chiang et al. | 257/718 |

* cited by examiner

*Primary Examiner*—Nitin Parekh
(74) *Attorney, Agent, or Firm*—Wei Te Chung

(57) ABSTRACT

A printed circuit board (PCB) with a differential pair arrangement includes a mounting area for receiving a chip, a plurality of first pads located near one edge of the mounting area, a plurality of second pads located near an opposite edge of the mounting area, the first pads and the second pads are arranged for receiving pins of the chip. A pair of vias is used for connecting layers of the PCB. The second pads are located between the vias and the mounting area. A differential pair includes two signal traces, one of the signal traces is connected to one of the first pads and routed to one of the vias through the mounting area, the other of the signal traces is routed through the mounting area and connected to one of the second pads and then routed to the other one of the vias.

2 Claims, 2 Drawing Sheets

PRINTED CIRCUIT BOARD WITH DIFFERENTIAL PAIR ARRANGEMENT

DESCRIPTION

1. Field of the Invention

The present invention relates to a printed circuit board (PCB), and particularly to a PCB for reducing common-mode noise.

2. Description of Related Art

Typically, a differential pair is a pair of signal traces that are used to transmit differential signals of a PCB. The differential pair is used to improve transmission characteristics of the signal traces because they should transmit two equivalent, inverting differential signals at the same time and are therefore, an important consideration in the design process of a PCB.

Referring to FIG. 2, a typical arrangement of PCB signal traces connecting a chip to vias is shown. The arrangement includes a rectangular mounting area 10a for receiving an integrated circuit (IC) chip, four vias 1a, 2a, 3a, and 4a positioned in the mounting area 1a. Six pads IC01a-IC06a are located along two opposite long edges of the mounting area 10a, for soldering pins of the IC chip to the pads IC01a-IC06a. The vias 1a, 2a, 3a, and 4a are routed through a component layer (top layer) to a solder layer (bottom layer) of the PCB. A first differential pair 100a and a second differential pair 200a are laid on the component layer of the PCB. Two differential pairs 300a and 400a are laid on the solder layer of the PCB. The first differential pair 100a includes two signal traces 101a and 102a. The signal trace 101a is connected to the pad IC06a and routed to the via 1a in the mounting area 10a, then connected to a signal trace 301a of a differential pair 300a. The signal trace 102a is connected to the pad IC01a and routed to the via 2a in the mounting area 10a, then connected to a signal trace 302a of the differential pair 300a. The second differential pair 200 includes two signal traces 201a and 202a. The signal trace 201a is connected to the pad IC03a and routed to the via 4a, then connected to a signal trace 401a of the differential pair 400a. The signal trace 202a is connected to the pad IC04a and routed to the via 3a through the mounting area 10a, then connected to a signal trace 402a of the differential pair 400a.

However, lengths of the signal traces 101a and 102a are different. Similarly, lengths of the signal traces 201a and 202a are different from each other as well. Common-mode noise comes about due to the differences in the lengths between one signal trace to another signal trace of differential pairs. Thus, the quality of the signal transmission characteristics is badly affected.

What is needed, therefore, is a arrangement for differential pairs of a printed circuit board (PCB) that reduces common-mode noise.

SUMMARY OF THE INVENTION

An exemplary printed circuit board (PCB) with a differential pair arrangement includes a mounting area for receiving a chip, a plurality of first pads located near one edge of the mounting area, a plurality of second pads located near an opposite edge of the mounting area, the first pads and the second pads are arranged for receiving pins of the chip. A pair of vias is used for connecting layers of the PCB. The second pads are located between the vias and the mounting area. A differential pair includes two signal traces, one of the signal traces is connected to one of the first pads and routed to one of the vias through the mounting area, the other of the signal traces is routed through the mounting area and connected to one of the second pads and then routed to the other one of the vias.

Other advantages and novel features will become more apparent from the following detailed description, in which:

DETAILED DESCRIPTION OF THE INVENTION

Figure 1:
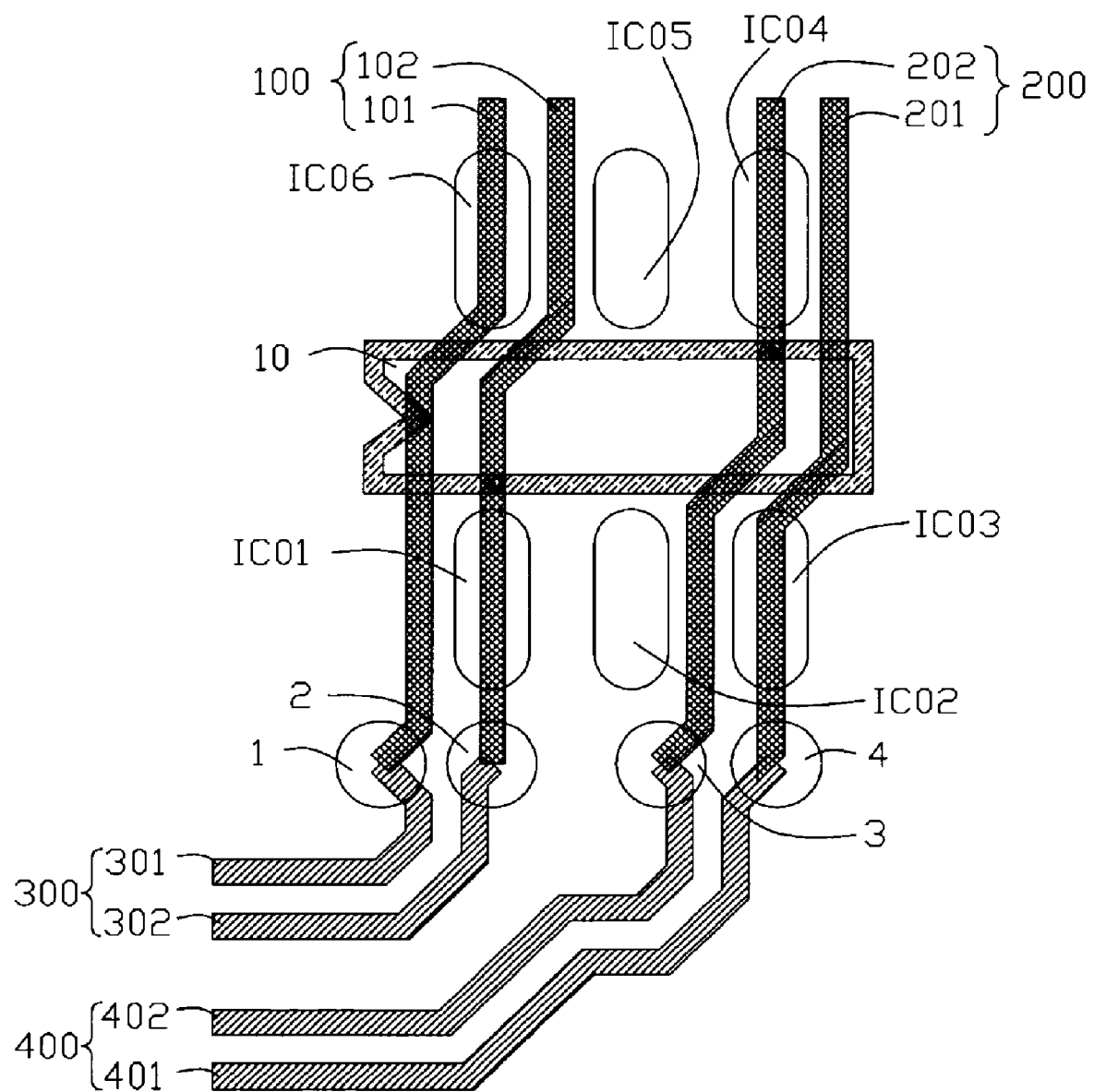
FIG. 1 is a schematic view of a printed circuit board (PCB) with a differential pair arrangement in accordance with a preferred embodiment of the present invention.
Figure 2:
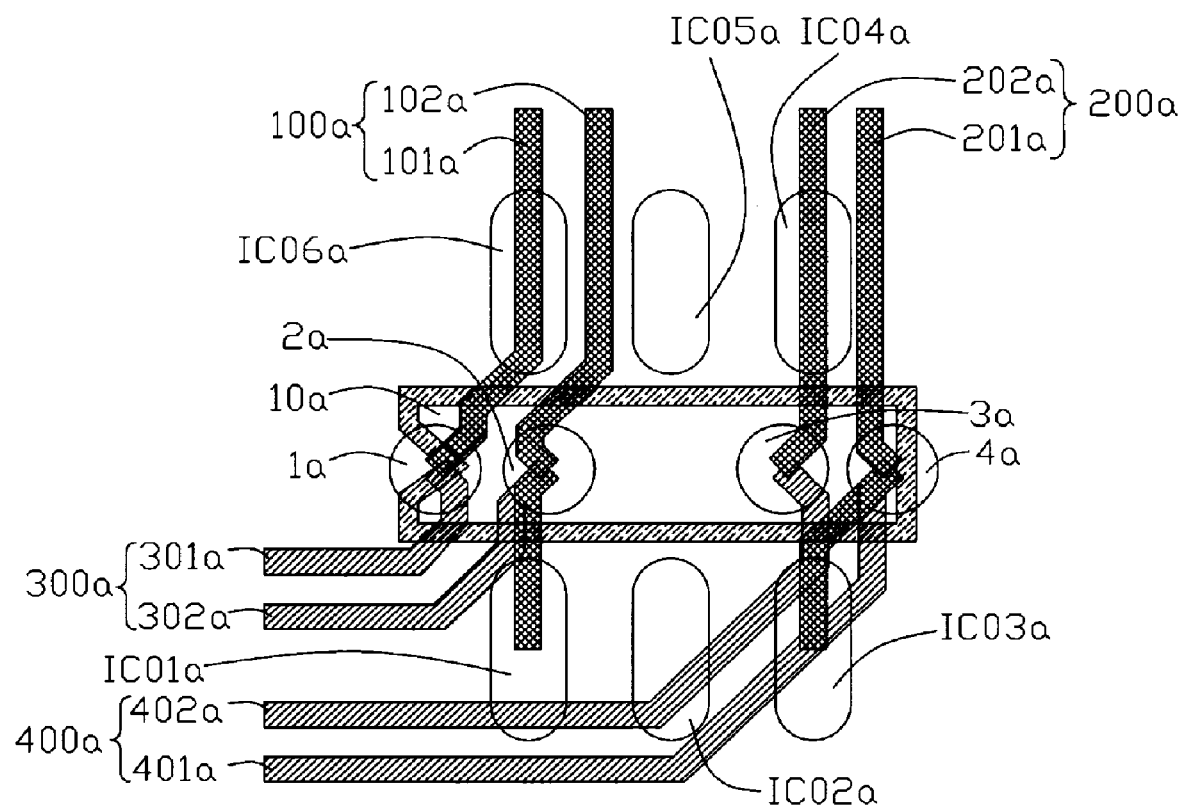
FIG. 2 is a schematic view of a typical arrangement of a PCB illustrating a differential pair connecting a chip to vias.

FIG. 1 shows a circuit assembly like a printed circuit board (PCB) with a differential pair in accordance with a preferred embodiment of the present invention. The arrangement includes a rectangular mounting area 10 for receiving an electronic component like an integrated circuit (IC) chip, six pads IC01-IC06, four vias 1, 2, 3, and 4, and four differential pairs 100, 200, 300, and 400. The differential pairs 100 and 200 are laid on a component layer (top layer) of the PCB. The differential pairs 300 and 400 are laid on a solder layer (bottom layer) of the PCB.

The pads IC01-IC06 are located along two opposite long edges of the mounting area 10. Signal pins of the IC chip are soldered to the pads IC01, IC03, IC04, and IC06, a power pin and a ground pin are soldered to the pads IC02 and IC05 respectively. The vias 1, 2, 3, and 4 are adjacent to the pads IC01, IC02, and IC03, providing connections from the component layer to the solder layer of the PCB. The differential pair 100 includes two signal traces 101 and 102. The signal trace 101 is connected to the pad IC06 and routed to the via 1 through the mounting area 10, then connected to a signal trace 301 of the differential pair 300. The signal trace 102 is routed through the mounting area 10 and connected to the pad IC01, then routed to the via 2, and connected to a signal trace 302 of the differential pair 300. The differential pair 200 includes two signal traces 201 and 202. The signal trace 201 is routed through the mounting are 10 and connected to the pad IC03, then routed to the via 4, and connected to a signal trace 401 of the differential pair 400. The signal trace 202 is connected to the pad IC04 and routed to the via 3 through the mounting area 10, then connected to a signal trace 401a of the differential pair 400. In such arrangement of pads and vias, the signal traces 201 and 202 are arranged to achieve a maximum equivalence in length to result in a complementary reduction of noise of the two signal traces.

In other embodiment, the vias 1, 2, 3, and 4 may be arranged adjacent to the pads IC04-IC06 corresponding to practical conditions.

The differential pair arrangement of the PCB produces signal traces of equal length thereby avoiding common-mode noise. When each differential pair 100 and 200 respectively transmit signals, common-mode noise between the signal traces 101 and 102 or 201 and 202 is counteracted because they transmit two equivalent but inverted signals simultaneously when in use, thus any resulting common-mode noise effects cancel each other.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A printed circuit board (PCB) with a differential pair arrangement comprising:
   a chip mounting area on one layer of the PCB for receiving the chip;
   a plurality of first pads located near one edge of the mounting area;
   a plurality of second pads located near an opposite edge of the mounting area, the first pads and the second pads being arranged for receiving pins of the chip;
   a pair of vias for connecting layers of the PCB, the second pads being located between the vias and the chip mounting area; and
   a differential pair comprising two signal traces, one of the signal traces being connected to one of the first pads and routed to one of the vias through the chip mounting area, the other of the signal traces being routed through the chip mounting area and connected to one of the second pads and then routed to the other one of the vias.

2. The PCB as claimed in claim 1, wherein the pair of vias is routed through the one layer to a solder layer at a bottom of the PCB opposite to the one layer.

* * * * *